United States Patent [19]
Koizumi

[11] Patent Number: 5,984,522
[45] Date of Patent: Nov. 16, 1999

[54] APPARATUS FOR INSPECTING BUMP JUNCTION OF FLIP CHIPS AND METHOD OF INSPECTING THE SAME

[75] Inventor: Takao Koizumi, Tokyo, Japan

[73] Assignee: NEC Corporation, Tokyo, Japan

[21] Appl. No.: 08/764,996

[22] Filed: Dec. 16, 1996

[30] Foreign Application Priority Data

Dec. 18, 1995 [JP] Japan .................................... 7-328452

[51] Int. Cl.⁶ .............................. G01N 25/72; G01J 5/00
[52] U.S. Cl. .......................... 374/5; 250/559.34; 438/15; 29/25.01
[58] Field of Search .................................. 374/4, 5, 6, 7, 374/124; 250/559.34, 559.45, 559.46; 438/15, 16, 142 FOR; 29/25.01

[56] References Cited

U.S. PATENT DOCUMENTS

| | | | |
|---|---|---|---|
| 5,052,816 | 10/1991 | Nakamura et al. | 374/5 |
| 5,111,048 | 5/1992 | Devitt et al. | 250/559.34 |
| 5,250,809 | 10/1993 | Nakata et al. | 250/559.34 |
| 5,473,259 | 12/1995 | Takeda | 324/760 |

FOREIGN PATENT DOCUMENTS 4-359447  12/1992  Japan .

*Primary Examiner*—Randy W. Gibson
*Attorney, Agent, or Firm*—Young & Thompson

[57] ABSTRACT

An apparatus for inspecting bump junctions in a semiconductor flip chip mounting which is able to inspect a state of a junction portion, has a simple structure and is safe and suitable for mass production of semiconductor devices and a method of inspecting the same; in an apparatus for inspecting bump junction in semiconductor flip chip mounting in which a semiconductor bare chip is mounted reversely on a substrate through the bumps, the surface of the semiconductor bare chip is irradiated with a laser light and radiation heat from the heated chip is detected with an infrared camera, a computer acquires temperature distribution on the chip surface from a picture processing unit and analyzes the temperature distribution, thereby to decide the quality of the bump junction state, and decision processing is performed by acquiring data of temperature distribution from a reference semiconductor device of known excellent quality in advance by the same method and comparing with these data.

11 Claims, 6 Drawing Sheets

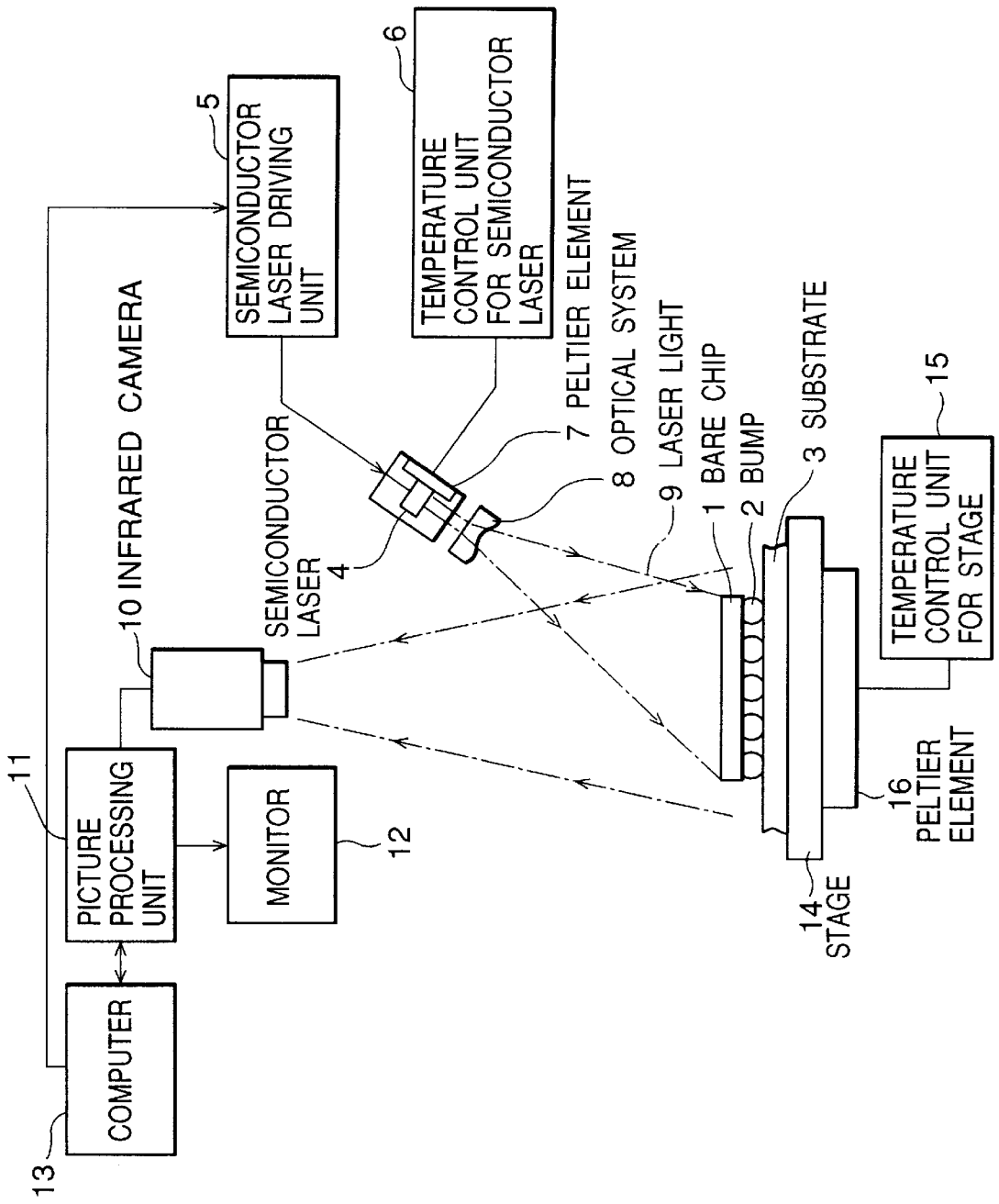

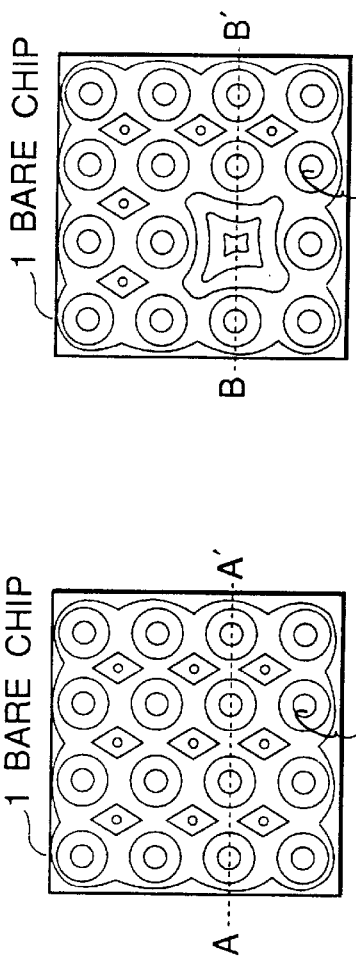
FIG. 4C
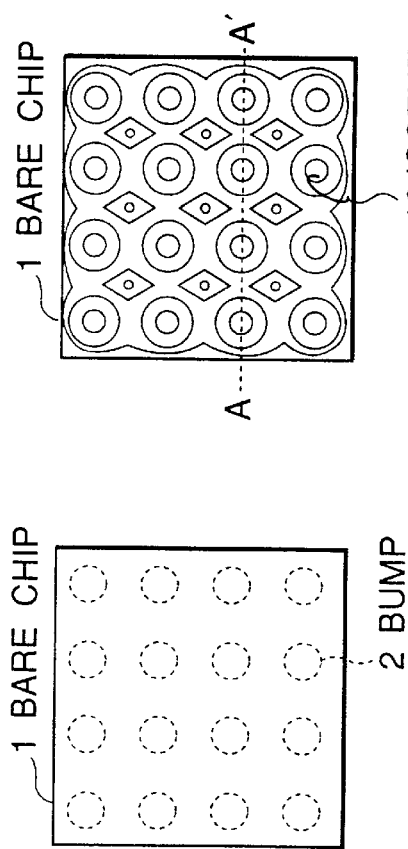
FIG. 4E
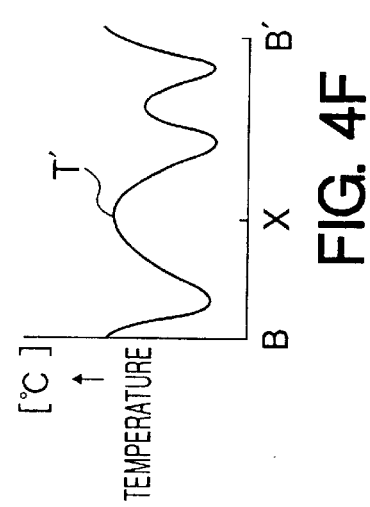
FIG. 4A
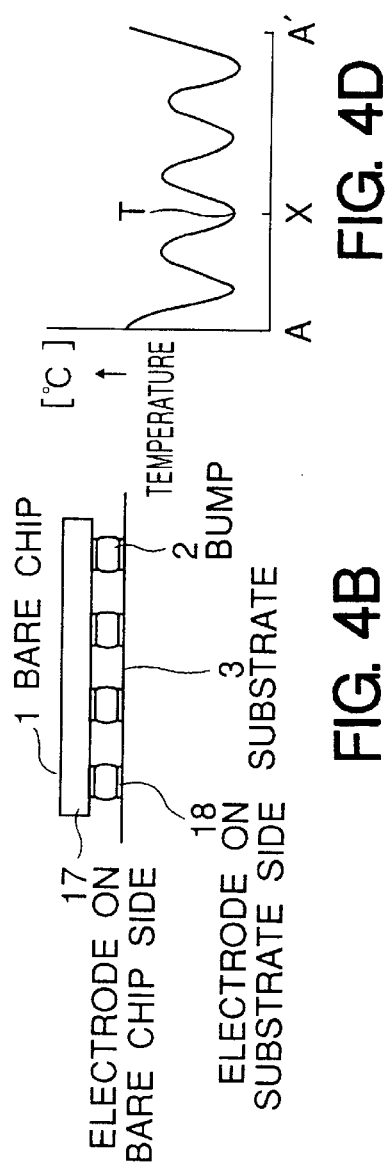
FIG. 4B
FIG. 4D
FIG. 4F

APPARATUS FOR INSPECTING BUMP JUNCTION OF FLIP CHIPS AND METHOD OF INSPECTING THE SAME

BACKGROUND OF THE INVENTION

1. Field of the Invention

The present invention relates to an apparatus for inspecting a bump junction of a semiconductor element and a substrate in a flip chip for performing inverted mounting on a substrate made of organic or ceramic matter through a bump or the like and a method of inspecting the same.

2. Description of the Related Art

In a flip chip which is attracting attention recently in advancing high density mounting, ball shaped metals or the like called bumps 2 are connected by soldering or the like to electrodes 17 of a plurality of bare chips 1 arranged evenly as shown in FIG. 1. These fitted bumps 2 are connected also by soldering or the like to electrodes 18 of a substrate made of an organic or ceramic matter or the like.

Since such a flip chip has a connecting portion with the substrate on the back of the bare chips 1 for the purpose of executing high density mounting, it has such a disadvantage in point of inspection that the connecting portion cannot be seen directly as against that the connecting portion was located at a position that could be seen directly in a conventional surface mount device (SMD) component.

Therefore, such a method that it is confirmed for the substrate in which flip chips are used whether connection has been made nicely by applying a current to the bare chip 1 and confirming the operation without inspecting the connection has been adopted at a stage of trial manufacture, but such an inspection method is not suitable for mass production. Further, in such a test with turning on electricity, the bare chip 1 is operated when an electric current is turned on under any circumstances of the connecting portion. Therefore, even when a large void has been generated at a portion where the bump 2 has been connected by soldering for example, judgement is made to be an excellent article since there is no problem electrically and sufficient connection inspection cannot be made in such a case, thus producing a reliability problem.

As a result, an apparatus for inspecting a connecting portion in bare chip mounting becomes necessary. In an apparatus for inspecting a solder junction portion of a semiconductor device shown in FIG. 2 (Patent Laid-Open No. HEI4-359447), it has been tried to make the junction portion of the bump 2 between a substrate 18 and a bare chip 17 visible by utilizing transmission of X-rays. In this apparatus, however, X-rays are radiated from right above the connecting portion so as to measure a shadow thereof. Therefore, an X-ray source has to be brought to right above the connecting portion, and the X-ray source has to be moved to right above of individual bump 2 at the connecting portion of the substrate 18 where a plurality of bumps 2 are arranged in flip chip mounting. Further, since the connecting portion cannot be visually observed directly, it is also difficult to move the X-ray source to right above the connecting portion. Furthermore, the X-ray source is expensive, and consideration for a human body also becomes necessary concerning the use thereof.

A flip chip which is presently focused with the spotlight of attention is a mounting method which has been developed for the purpose of executing high density mounting, but it is a mounting construction in which the junction portion between the bare chip and the substrate cannot be visually observed directly because high density mounting is performed. Therefore, a conventional inspection apparatus of a type used for an SMD component or the like is not applicable to the connection inspection of flip chip mounting in which the junction portion cannot be observed directly.

Further, although that which utilizes an X-ray apparatus has been invented as an inspection apparatus for flip chips, there have been extremely difficult problems in such points that not only there are difficult points in point of mechanism such as arrangement and movement of an X-ray source for inspection, but also consideration for a human body is required thus making products expensive.

As described above, since there has been heretofore no suitable inspection apparatus for flip chips, it is foreseen that yield of flip chips is deteriorated, and future progress or realizability of high density mounting by flip chips is apprehended due to cost increase.

Therefore, a non-contact inspection apparatus and inspection method that can be used preferably for such flip chips and are provided with sufficient inspection performance suitable for mass production of semiconductor devices have been desired.

SUMMARY OF THE INVENTION

It is an object of the present invention to provide an apparatus for inspecting a bump junction of a flip chip which is capable of inspection of the state of bump junction portion with high precision, safe with a simple structure and suitable for mass production of semiconductors and a method of inspecting the same.

In order to achieve the above-mentioned object, an apparatus for inspecting bump junctions of flip chips according to the present invention includes, in an apparatus for inspecting bump junctions of flip chips with a semiconductor chip mounted reversely on a substrate through bumps, heat ray generating means for irradiating the semiconductor chip with heat rays, sensor means for detecting radiation heat radiated by heating of the semiconductor chip, and decision processing means for deciding the quality of the bump junction portion based on temperature distribution on the surface of the semiconductor chip obtainable from the radiation heat and arrangement information of the bumps of the semiconductor chip.

It simplifies signal processing and shortens the inspection time, thus making suitable for mass production to form the decision processing means so as to decide the quality of the bump junction portion depending on the temperature distribution of only the temperature on the surface of the semiconductor chip at the bump junction portion or the temperature distribution of only the temperature on the surface of the semiconductor chip at the bump junction portion and an intermediate portion between bump junctions, or to form the decision processing means so as to acquire the temperature distribution by detecting the output of the sensor means in a transient state of temperature rise from the start of irradiation with heat rays onto the surface of the semiconductor chip at least once, or to form a combination thereof.

Further, in respective bump junction inspection apparatus described above, it is suitable for excluding the influence by temperature disturbance to form a structure having temperature control means for unifying the temperature of the substrate of the flip chips at heating temperature of the semiconductor chip or lower, or to form a structure having temperature detection means for measuring the temperature of the substrate of the flip chips, in which the decision control means makes decision by obtaining the relative temperature distribution between the semiconductor chip surface and the substrate by the output of the temperature detection means.

Further, the arrangement information of the bumps of the semiconductor chip is suitable to form the temperature distribution on the semiconductor chip surface of a semiconductor device of excellent quality acquired under the same conditions as the object of inspection.

Furthermore, in respective bump junction inspection apparatus, it. is suitable for the heat ray generating means to use laser means such as a semiconductor laser and a He—Ne laser or lamp light source means such as a xenon lamp and a mercury lamp.

Further, it is suitable to use an infrared image pickup camera for the sensor means of respective bump junction inspection apparatus, and furthermore, monitor means for displaying the temperature distribution may be provided so as to be utilized for inspection with visual observation.

Further, a method of inspecting bump junction according to the present invention includes, in a method of inspecting bump junction of a semiconductor device in which a semiconductor chip is mounted reversely on a substrate through bumps, a step of heating by irradiating the semiconductor chip with heat rays, a step of detecting radiation heat radiated from the semiconductor chip, a step of generating temperature distribution on the surface of the semiconductor chip from the detected radiation heat, and a step of deciding the quality of a bump junction portion in the temperature distribution based on the arrangement information of the bumps of the semiconductor chip.

Further, the step of generating temperature distribution on the surface of the semiconductor chip includes a step of generating temperature distribution of only the temperature on the semiconductor chip surface at the bump junction portion or temperature distribution of only the temperature on the semiconductor chip surface at the bump junction portion and an intermediate portion between bump junction portions from radiation heat detected from the semiconductor chip, or the step of generating temperature distribution on the semiconductor chip surface includes a step of acquiring temperature distribution in a transient state of temperature rise of the semiconductor chip from the start of irradiation with heat rays onto the semiconductor chip surface, or a step of combination of these steps.

Further, the step of generating temperature distribution on the surface of the semiconductor chip includes a step of measuring the temperature of the substrate of the semiconductor device thereby to obtain relative temperature distribution between the semiconductor chip surface and the substrate as the temperature distribution described above.

Furthermore, the invention includes a step of acquiring a temperature distribution on reference semiconductor chip surface of a semiconductor device of known excellent quality under the same conditions as acquisition of the temperature distribution described above as arrangement information of the bumps of the semiconductor chip.

To be more concrete, according to the present invention, heat rays are radiated onto the surface of the bare chip where soldered flip chips are mounted on the substrate through solder bumps, the temperature rise on the bare chip surface is measured with an infrared image pickup device, and the results of the measurement are stored in a computer. Further, similar measurement is made in advance with respect to the bare chip on which the flip chip of excellent quality is mounted, and the results of measurement are stored in a computer. Thus, the junction portion of flip chip mounting is inspected by comparing the results of measuring an excellent article with the result of measuring an object of inspection.

The temperature rises as compared with an excellent article at the portion where heat is to be radiated on a substrate from the bare chip through the bumps when bump connection is not made nicely because of poor soldering or the like. Therefore, distinction is made between excellent articles and inferior articles by computing the result of measurement taken into a computer from an infrared image pickup device and the result of measurement of excellent articles and comparing both results in advance.

BRIEF DESCRIPTION OF THE DRAWINGS

FIG. 3 is a diagram for explaining a structure of a first embodiment of the present invention;

FIG. 4 is a diagram for explaining the operation of the present invention;

DETAILED DESCRIPTION OF A PREFERRED EMBODIMENT OF THE INVENTION

Figure 1:
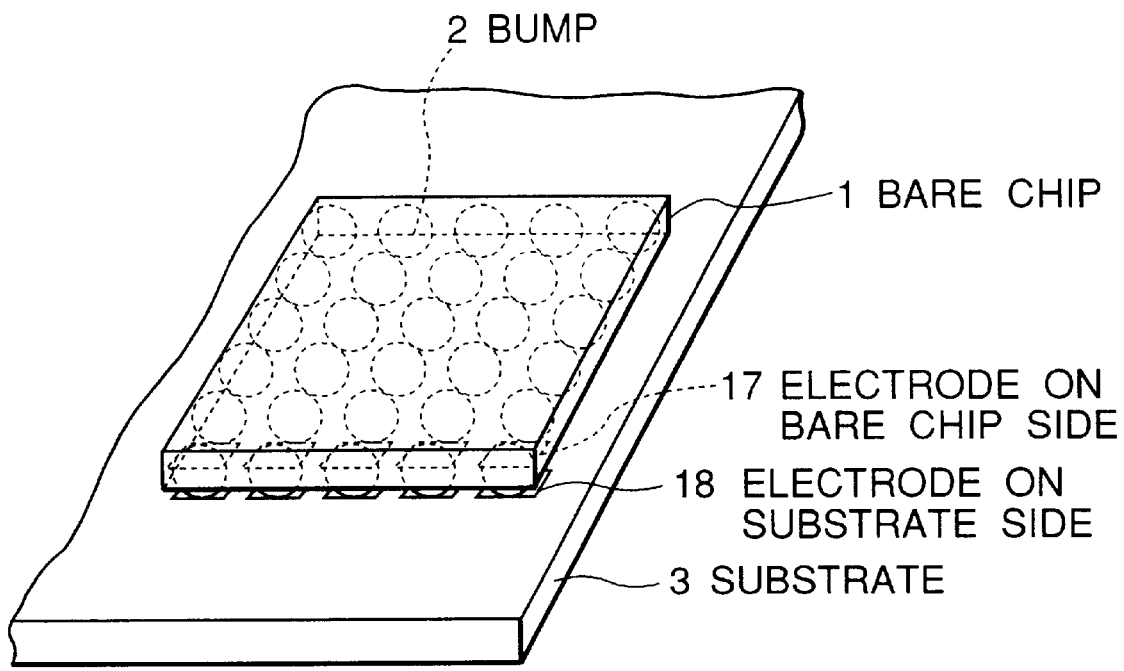
FIG. 1 is a perspective view of flip chip mounting through bumps.
Figure 2:
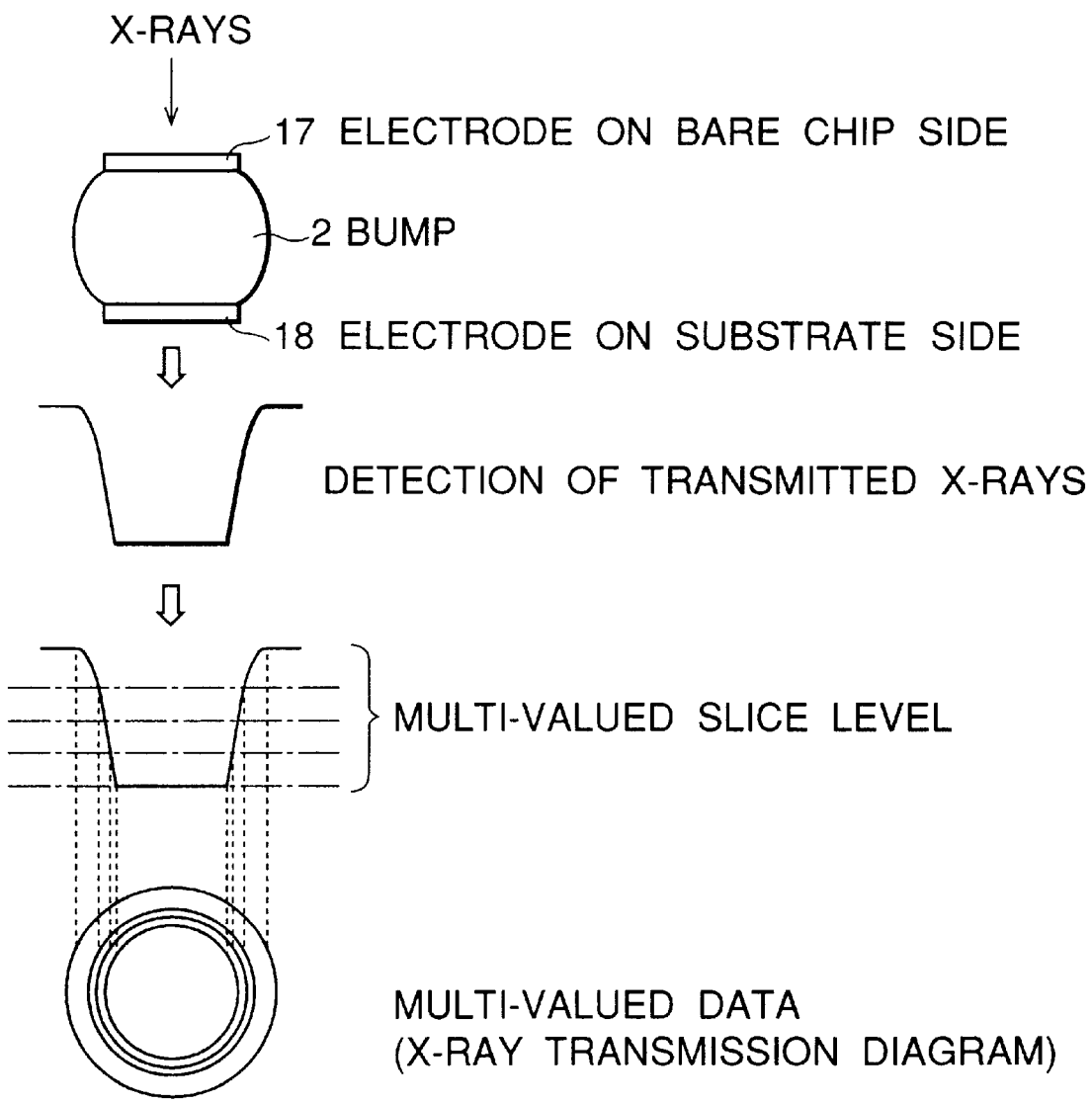
FIG. 2 is a principle diagram showing an X-ray transmission method of a prior art.

FIG. 3 is a diagram showing a structure of a first embodiment of the present invention.

As shown in FIG. 3, an apparatus for inspecting bump junction of flip chips of the present invention is composed of a semiconductor laser unit for heating principally a bare chip 1 which is an object of inspection, an infrared image pickup device for measuring temperature distribution on the surface of the bare chip 1 and a computer 13.

The semiconductor laser unit is composed of a semiconductor laser 4 that is a light source for heating, an optical system 8, a temperature control unit 6 for the semiconductor laser, and a semiconductor laser driving unit 5. The semiconductor laser 4 oscillates by being supplied with a constant current of low noise by means of the semiconductor laser driving unit 5. Long life of the semiconductor laser 4 can be expected by such a driving unit. Further, the semiconductor -Laser driving unit 5 is controlled by means of the computer 13 and is able to control the driving current of the semiconductor laser 4. A laser light 9 emitted from the semiconductor laser 4 passes through the optical system 8 of a concave lens and is regulated so as to heat the whole bare chip 1.

The infrared image pickup device is composed of an infrared camera 10, a picture processing unit 11 and a monitor 12. The infrared camera 10 is arranged at a location where the whole flip chip mounted bare chip 1 can be photographed, and the temperature distribution is displayed on the monitor 12 through the picture processing unit 11. The results of measurement are introduced into the computer 13. The computer 13 controls the semiconductor laser unit and the infrared image pickup device, and takes in the results of measurement and passes judgement on excellent articles and inferior articles.

An object of inspection which is a substrate mounted with flip chips is fixed to a stage 14 made of a metal of high thermal conductivity, a ceramic material or the like fitted with a Peltier element 16 controlled by a temperature control unit 15 for stage.

Figure 5:
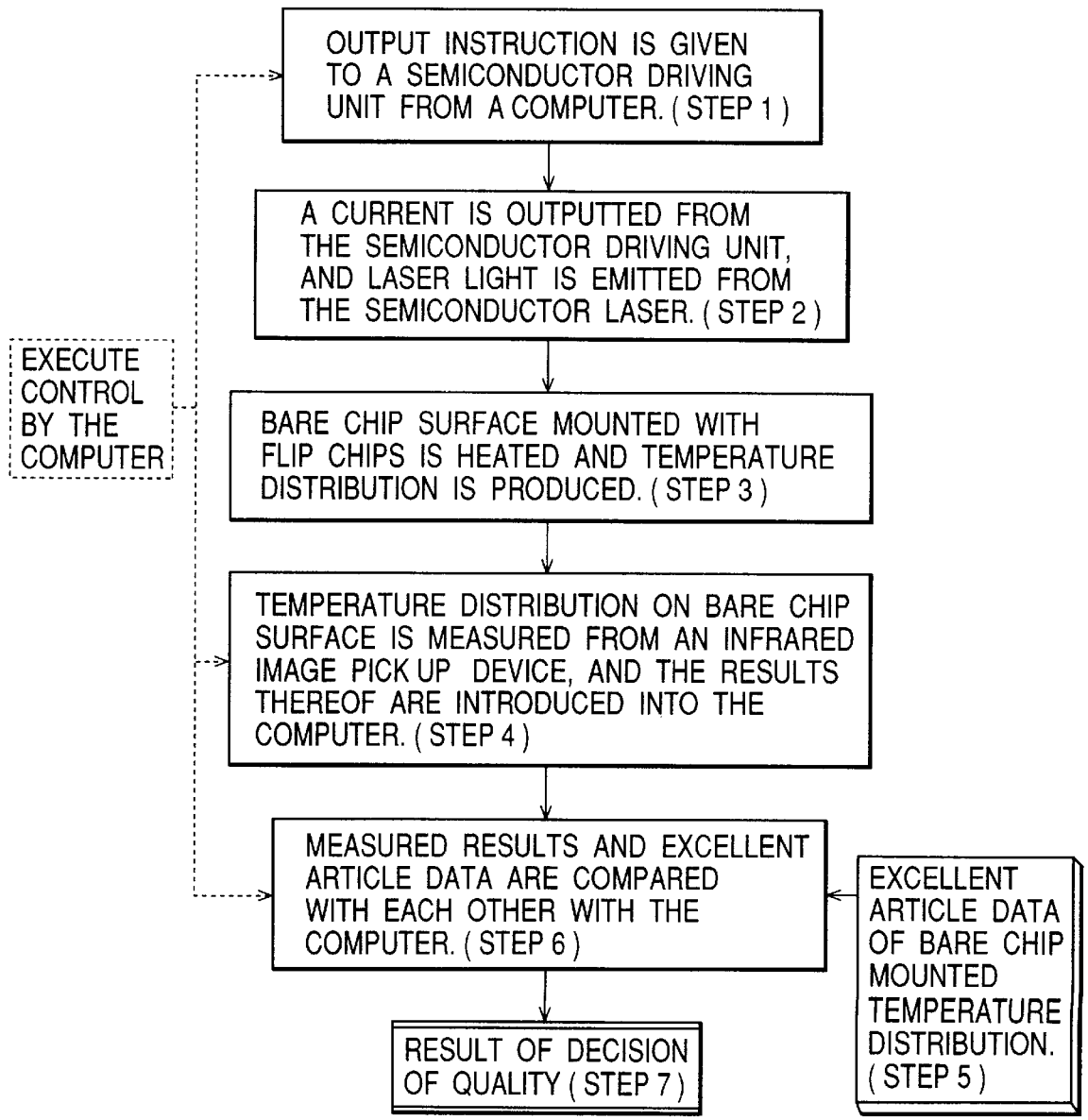
FIG. 5 is a flow chart of measurement process of the first embodiment of the present invention.

Next, the operation of inspection of the present embodiment will be described with reference to FIG. 4 showing the temperature distribution of the bare chip and FIG. 5 showing a measurement flow chart.

A signal is generated from the computer 13 to the semiconductor laser driving unit 5 so that a current for driving the semiconductor laser 4 is outputted (STEP1). A step shaped output current is outputted from the semiconductor laser driving unit 5, the semiconductor laser 4 oscillates and outputs a pulse shaped or a step shaped laser light 9 (STEP2). The emitted laser light 9 passes through the concave lens of the optical system 8 and heats the whole bare chip 1 mounted with flip chips in a step form so as to warm it sufficiently.

At this time, in case the flip chips are excellent articles and the bare chip 1 is connected to the substrate 3 through the bumps 2, the temperature distribution on the surface of the bare chip 1 appears as shown in FIG. 4(C), and the temperature distribution of a part thereof (between A–A') is shown in FIG. 4(D) in a graph form. On the contrary, when there is a bump having inferior junction, the temperature distribution on the surface of the bare chip 1 is as shown in FIG. 4(E), the temperature distribution of a part thereof (between B–B') is shown in FIG. 4(F) in a graph form, and heat becomes difficult to escape from the bump of inferior connection. Therefore, the temperature T' of an inferior article becomes higher at the same point X as compared with the temperature T of an excellent article.

As described above, temperature distribution is generated on the surface of the heated bare chip 1 depending on a state of bump connection (STEP3). This temperature distribution is taken into the computer 13 from the picture processing unit 11 as picture information by means of the infrared camera 10 (STEP4). It is after the lapse of time so as to be warmed sufficiently with the laser light 9 emitted by the signal of the computer 13 that the temperature distribution is taken into the computer 13, and a signal is outputted again from the computer 13 to the picture processing unit so as to measure the temperature distribution on the surface of the bare chip 1, which is performed automatically. The monitor 12 is connected to the picture processing unit 11, and the temperature distribution of the bare chip 1 can be always observed.

In such a manner, the quality of the connection state of flip chips is decided from the temperature distribution of the measured absolute temperature. For the decision, excellent article data of the temperature distribution obtained by measuring excellent articles of flip chips, i.e., those without imperfections, in advance are stored in the computer 13 (STEP5). It is desirable to obtain the average of a plurality of excellent article data in place of one data only for these excellent article data. The coordinates position of picture information of the excellent article data and the measurement data are put together, and the finite difference of the temperature is obtained ΔZ (STEP6). When both have exactly the same temperature distribution, the temperature difference always shows 0, but, since dispersion is produced to some extent practically even for excellent articles, decision is made to be excellent articles in case of within a certain temperature difference. When there is an inferior connection point, a point where the temperature difference becomes large is produced, thus making it possible to decide to be inferior, when the finite difference from excellent article data is obtained (STEP7).

Further, the Peltier element 16 and the temperature control unit 15 for stage 14 keep the temperature at the bottom face of the substrate 3 mounted with flip chips fixed on the stage 14 constant, and thus produce a temperature distribution on the surface of the bare chip 1 stably corresponding to the state of bump junction, thus having an operation of excluding the influence by temperature disturbance.

A method of shortening the measurement time using the same measurement system will be described.

A first method: In the above-mentioned method, the bare chip has been heated sufficiently, and measurement has been made when the temperature was stabilized. Since some period of time becomes necessary until the temperature is stabilized, however, this is a method of measuring temperature distribution during heating with the laser light 9, in other words, in a transient state.

By means of a signal from the computer 13, a pulse shaped laser light 9 is emitted, thereby to heat the bare chip surface. Thereafter, the temperature distribution on the surface of the bare chip 1 is taken into the computer 13 after a short time interval. This short time interval is always kept instant. It is a matter of course that excellent article data are obtained through similar measurement. The decision of the quality can be made in a similar manner to the above-mentioned method.

A second method: In the above-mentioned embodiment, the temperature difference between excellent (reference) article data and measured data is computed thereby to decide the quality. When data are being processed as picture information, however, it takes time because the data quantity is large. Therefore, it is possible to shorten the measurement period of time when a method of deciding the quality by extracting the temperature distribution of only the temperature data on the surface of the bare chip 1 at respective bump junction portions that are arranged in a plurality of quantity from the measured picture information, extracting also excellent article data in a similar manner and measuring respective temperature differences. Further, it is also possible to aim at shortening of required measurement period of time by making decision utilizing the temperature distribution composed of data on the surface of the bare chip at an intermediate portion between bump junction positions in addition to the data on the surface of the bare chip at a plurality of bump junction portions.

A third method: When the first and the second methods are combined together, further shortening of the measurement period of time becomes possible.

Figure 6:
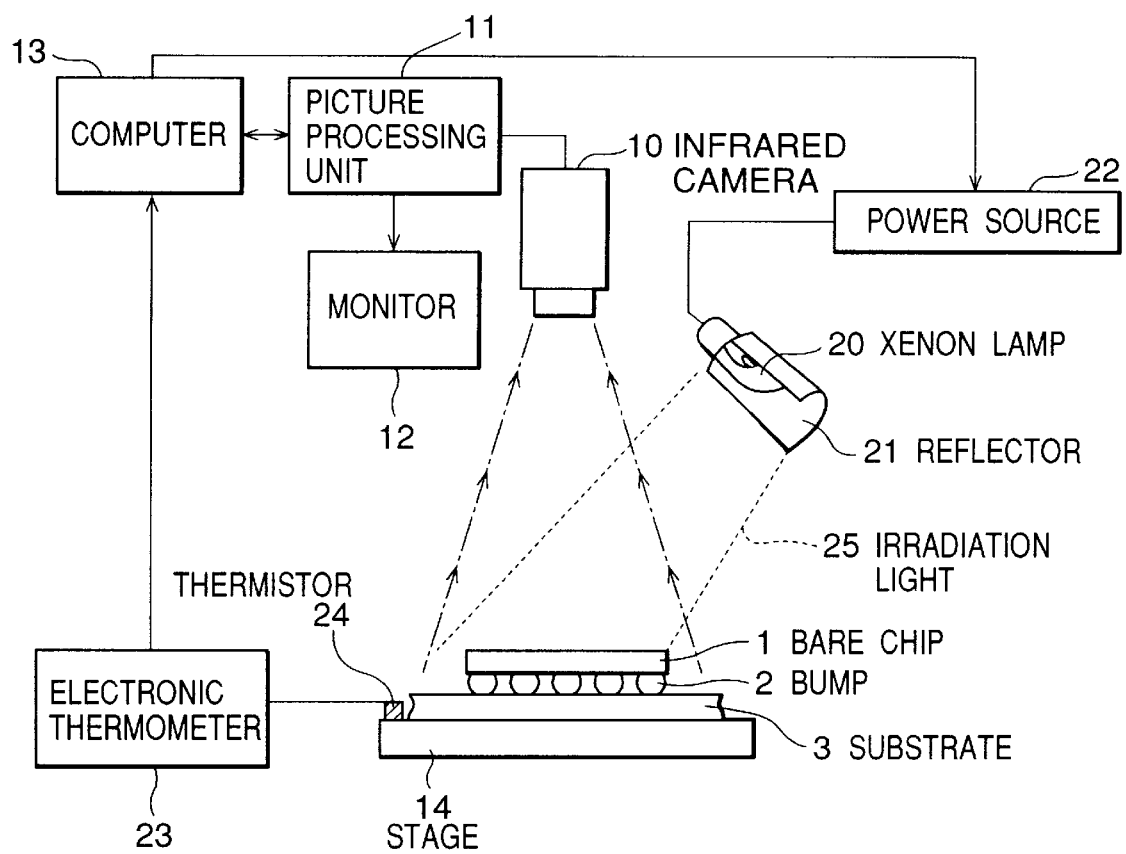
FIG. 6 is a diagram for explaining a structure of a second embodiment of the present invention.

FIG. 6 is a diagram showing a structure of a second embodiment of the present invention.

As shown in FIG. 6, an apparatus for inspecting bump junction of flip chips in a structure of the present embodiment is composed of a xenon lamp 20 for heating principally the object of inspection, an infrared image pickup device for measuring temperature distribution on the surface of the bare chip 1 and the computer 13.

The xenon lamp 20 is connected to a power source 22, and the power source 22 is connected to the computer 13. Further, the light emitted from the xenon lamp 20 is regulated so as to heat the whole bare chip 1 by means of a reflector 21.

The infrared image pickup device is composed of an infrared camera 10, a picture processing unit 11 and a monitor 12. The infrared camera 10 is arranged at a position where the whole bare chip 1 mounted with flip chips can be photographed, and the temperature distribution is displayed on the monitor 12 through the picture processing unit 11.

The results of measurement are taken into the computer 13. The computer 13 controls the xenon lamp 20 and the infrared image pickup device, and further takes in the results of measurement and makes decision on the quality.

A measuring method will be described.

A signal is outputted from the computer 13 so as to output voltage to the power source 22 of the xenon lamp 20, and the xenon lamp 20 emits light.

The temperature distribution of the absolute temperature on the surface of the bare chip 1 heated with irradiation light 25 of the xenon lamp 20 where the temperature distribution having been produced is measured. At this time, the temperature at the bottom face of the substrate 3 or the stage 14 is measured at the same time by means of an electronic thermometer 23 through a thermistor 24, and is taken into the computer 13. A relative temperature distribution to the bottom face of the substrate 3 or the stage 14 is obtainable by obtaining a difference from the temperature indicated by the electronic thermometer 23 with respect to the temperature distribution of measured absolute temperature. In this way, the measured relative temperature distri bution is effective as the means for excluding temperature disturbance.

As to excellent article data, the absolute temperature distribution is also measured and is stored in the computer 13 as excellent article data.

The positions of the thermistor 24 which become a criterion of the relative temperature have to be all at the same position. Also, the irradiation light 25 of the xenon lamp should not be applied directly. The decision on the quality is made from the measured relative temperature distribution by the method of above-mentioned embodiment.

Although a relative temperature distribution between temperatures at the substrate of a semiconductor device mounted with flip chips and on the chip surface is obtained as to the temperature distribution by utilizing the output of the thermistor 24 in the present embodiment, it may also be arranged so as to utilize the absolute temperature distribution on the chip surface. In this case, it is preferable to structure so as, to exclude the influence by disturbance using the temperature control unit similarly to the first embodiment. Further, in an embodiment shown in FIG. 6, it is also possible to apply the afore-mentioned first to third methods of shortening the measurement period of time for shortening the measuring time of the temperature distribution of the chip. When the above-mentioned second method is applied, it may also be arranged so as to perform acquisition of data in a transient state in a plurality of times at every fixed short period of time, thereby to make a decision.

Further, in the first embodiment shown in FIG. 3, it is apparent that a structure shown in FIG. 6 of using measured substrate temperature can be adopted so as to utilize the relative temperature distribution.

Furthermore, in both embodiments, the method of inspecting bump junction is to decide the quality of a semiconductor device by comparing the data of temperature distribution measured from the chip surface of an object of inspection with the temperature distribution data measured in advance with respect to a semiconductor device of excellent quality under similar conditions, but it is also possible to structure so as to make decision by performing analysis and computation of the pattern of temperature distribution measured with the chip of the object of measurement by the computer without depending on the comparison mentioned above because of a reason that, when an arrangement structure of the bump on the chip surface and arrangement information such as a pattern thereof are known, the above-mentioned temperature distribution can be estimated in accordance therewith.

Further, the chip which is the object of inspection in the present invention is not limited to one piece as shown in the figure. Namely, it is apparent that the present invention is able to correspond still larger mass production of semiconductor devices when it is arranged so that temperature distribution data of respective chips are acquired from a plurality of chips or a plurality of semiconductor devices at the same time and inspected collectively.

Besides, a semiconductor laser and a xenon lamp have been shown as an employment example of heating means of the bare chip in the present embodiment, but it is possible to use helium-neon (He—Ne) laser, a mercury lamp or the like in place thereof.

The present invention being structured as described above, it has effects as described hereunder.

By inspecting bump junction by the surface temperature distribution of a semiconductor chip, it is possible to realize safe inspection for flip chip mounting which is capable of inspecting a solder junction portion and is suitable for mass production by a very simple structure and method.

Further, by utilizing temperature distribution at a required portion of the chip and/or temperature distribution in a heating transient state of the chip, it is possible to reduce the data used for the decision of the quality, to shorten the time required for inspection, and to realize inspection corresponding to larger mass production.

It is possible to exclude the influence by surrounding atmospheric temperature which causes disturbance and to improve accuracy of decision inspection by utilizing absolute temperature distribution in which the temperature of the substrate of the semiconductor device is set to a constant temperature lower than the chip heating temperature or by measuring the temperature of the substrate and utilizing the relative temperature. Further, by utilizing measured data under the same conditions of a semiconductor device of excellent quality for judgement by chip temperature distribution, it is also possible to improve accuracy of decision inspection.

Furthermore, there are such effects that a laser apparatus or a lamp light source which is inexpensive and safe as compared with an X-ray source can be utilized, and inspection by visual observation becomes possible by connecting the apparatus to a monitor unit.

I claim:

1. An apparatus for inspecting bump junctions of production flip chips in which a semiconductor chip is mounted reversely on a substrate through bumps, comprising:

heat ray generating means for irradiating said semiconductor chip with heat rays;

sensor means for detecting radiation heat radiated by heating of said semiconductor chip;

decision processing means for deciding the quality of a bump junction portion based on a temperature distribution on the surface of said semiconductor chip obtained from said radiation heat and arrangement information of bumps of said semiconductor chip; and temperature control means for unifying the temperature of said substrate.

2. An apparatus for inspecting bump junction of flip chips according to claim 1, wherein the decision processing means decides the quality of a bump junction portion by temperature distribution of only the temperature on the surface of the semiconductor chip at a bump junction portion or temperature distribution of only the temperature on the surface of the semiconductor chip at a bump junction portion and an intermediate portion between bump junctions.

3. An apparatus for inspecting bump junction of flip chips according to claim 2, wherein the decision processing means detects an output of sensor means in a transient state of temperature rise from the start of irradiation with heat rays onto the surface of said semiconductor chip at least once, thereby to acquire said temperature distribution.

4. An apparatus for inspecting bump junctions of flip chips according to claim 1, wherein said temperature control means for unifying the temperature of said substrate is adapted to maintain said temperature of said substrate at the heating temperature of the semiconductor chip or lower.

5. An apparatus for inspecting bump junction of flip chips according to claim 1, further comprising temperature detection means for measuring the temperature of said substrate, in which said decision processing means obtains relative temperature distribution between the semiconductor chip surface and the substrate by the output of said temperature detection means, thereby to make decision.

6. An apparatus for inspecting bump junctions of production flip chips according to claim 1, further comprises arrangement information of bumps for a temperature distribution of the surface of a reference semiconductor chip of known excellent quality acquired under the same conditions as the acquisition of said temperature distribution of said production flip chips.

7. An apparatus for inspecting bump junctions of production flip chips according to claim 1, wherein the heat ray generating means comprises a laser means comprising one of a semiconductor laser and a He—Ne laser.

8. An apparatus for inspecting bump junctions of production flip chips according to claim 7, wherein the heat ray generating means comprises a lamp light source means comprising one of a xenon lamp and a mercury lamp.

9. An apparatus for inspecting bump junction of flip chips according to claim 1, wherein the sensor means is an infrared image pickup camera.

10. An apparatus for inspecting bump junction of flip chips according to claim 1, further comprising monitor means for displaying temperature distribution.

11. An apparatus for inspecting bump junctions comprising:

a stage having a first side designed and adapted to mount a flat side of a substrate of a semiconductor device with a semiconductor chip and bumps located intermediate the substrate and semiconductor chip, the bumps contacting a first side of the semiconductor chip and a second side of the substrate;

said stage having a second opposing said first side in contact with a temperature control means designed and constructed to maintain the substrate at a constant temperature;

a heat generating means for irradiating a second side of the semiconductor chip;

a sensor means for detecting radiation heat radiated by heating the semiconductor chip; and a decision process means for determining the quality of a bump junction portion based on a temperature distribution of the first surface of the semiconductor chip obtained from said radiation heat and arrangement information of the bump.

* * * * *